(12) United States Patent
Hwang

(10) Patent No.: US 6,925,706 B2
(45) Date of Patent: Aug. 9, 2005

(54) INDEX HEAD IN SEMICONDUCTOR DEVICE TEST HANDLER

(75) Inventor: Hyun Joo Hwang, Kyonggi-do (KR)

(73) Assignee: Mirae Corporation, Choongchongnam-Do (KR)

(*) Notice: Subject to any disclaimer, the term of this patent is extended or adjusted under 35 U.S.C. 154(b) by 479 days.

(21) Appl. No.: 10/033,981

(22) Filed: Jan. 3, 2002

(65) Prior Publication Data

US 2002/0088113 A1 Jul. 11, 2002

(30) Foreign Application Priority Data

Jan. 9, 2001 (KR) .......................................... 2001-1118

(51) Int. Cl.⁷ ................................................. H05K 3/30
(52) U.S. Cl. ............................ 29/740; 29/741; 29/739; 324/760; 324/765
(58) Field of Search ........................... 29/741, 743, 740, 29/759, 760; 324/760, 765, 158, 754; 439/72, 330, 487; 414/744.3; 294/2, 64.1

(56) References Cited

U.S. PATENT DOCUMENTS

| | | | | |
|---|---|---|---|---|
| 3,604,108 A | * | 9/1971 | Mallery .................. | 29/593 |
| 4,817,273 A | * | 4/1989 | Lape et al. ............. | 29/741 |
| 5,360,348 A | * | 11/1994 | Johnson ................. | 439/72 |
| 6,104,204 A | * | 8/2000 | Hayama et al. ........ | 324/760 |
| 2002/0088113 A1 | * | 7/2002 | Hwang .................. | 29/743 |

* cited by examiner

*Primary Examiner*—Minh Trinh
(74) *Attorney, Agent, or Firm*—Fleshner & Kim, LLP.

(57) ABSTRACT

An index head assembly for a semiconductor device test handler is provided which allows for precise positioning of a device in a test socket, as well as accurate testing of the device once properly positioned in the test socket. The head portion of the index head assembly includes a holding part which absorbs and holds the device using a vacuum force, a heating part which generates heat to maintain the device at the appropriate temperature, and a compliance part which accurately aligns and positions the index head relative to the test socket so that the device may be properly connected to the test socket. The downward force used to connect the semiconductor device to the test socket is controlled by a force transducer, and the temperature of the semiconductor device is accurately controlled through direct heat transfer from an electric heater provided within the head portion of the index head assembly. A plurality of ball plungers and guide members, as well as the particular installation of various parts of the head portion relative to one another ensure proper alignment of the device within the test socket.

21 Claims, 11 Drawing Sheets

INDEX HEAD IN SEMICONDUCTOR DEVICE TEST HANDLER

This application claims the benefit of the Korean Application No. P2001-1118 filed on Jan. 9, 2001, which is hereby incorporated by reference.

BACKGROUND OF THE INVENTION

Field of the Invention

The present invention relates to an index head in a semiconductor device test handler, and more particularly, to an index head in a semiconductor device test handler for mounting semiconductor device in a test socket at a test site.

Background of the Related Art

In general, modular ICs, in which memory, and/or non-memory semiconductor devices are fabricated on one substrate appropriately in circuit basis, are main components that serve important functions in computers or home appliances, which are shipped after various testing. As known, the handler is equipment required for automatic testing of the semiconductor device and modular RAM.

In general, many of the handlers are designed to carry out, not only a general performance tests under a room temperature, but also high temperature tests, and low temperature tests in which the semiconductor devices, the modular ICs, and the like are tested if they are operative normally under an extremely high temperature, or low temperature environment formed by using electric heater or liquefied nitrogen spraying system into a enclosed chamber at the test site.

In the meantime, the index head in the handler serves holding semiconductor devices in the test site under such an extremely high or low temperature, and mounting/dismounting to/from test sockets, as well as pressing down the semiconductor devices in a state the semiconductor devices are mounted in the test sockets for reducing contact resistances between the sockets and leads on the semiconductor devices.

The index head also serves to prevent a temperature drop of the semiconductor devices in the sockets during temperature testing by blowing hot air to the semiconductor devices in a state the index head presses down the semiconductor devices. However, the foregoing related art index head has the following problems.

First, in the hot air blowing for prevention of the temperature drop of the semiconductor devices, an accurate temperature control has been difficult, and even parts that require no heating are heated.

Second, the related art index head is provided with a compliance mechanism (or a floating mechanism) for an exact alignment between the held semiconductor devices and the sockets, which becomes shaky in high speed operation of the index head, that limits an operation speed of the index head.

Third, because a pressing down force of the index head on the semiconductors in the sockets influences a result of the test, it is required to control and monitor the pressing down force. However, the related art index head is not provided with devices for automatic control and monitoring the pressing down force, such that a worker is required to make sure and adjust the force, personally. Accordingly, an accurate control of the force has been difficult, and if the force is excessive, the semiconductor devices are damaged.

SUMMARY OF THE INVENTION

Accordingly, the present invention is directed to an index head in a semiconductor device test handler that substantially obviates one or more of the problems due to limitations and disadvantages of the related art.

An object of the present invention is to provide an index head in a semiconductor device test handler, which permits an accurate temperature control, a stable operation of the compliance mechanism, and an automatic accurate control of a pressing down force.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the index head in a semiconductor device test handler, for holding semiconductor devices, and mounting/dismounting to/from test sockets, includes a carrier base fixedly fitted to a transfer device movable in any direction, an elevating carrier coupled to the carrier base to be movable in up and down directions, elevating means for moving the elevating carrier in up and down directions with respect to the carrier base, a head holder under the elevating carrier coupled to the elevating carrier via a guide member for making relative movement with respect to the elevating carrier in up and down directions, and a plurality of heads each including a holding part fixedly fitted to a bottom of the head holder for holding the semiconductor device by vacuum, a heating part on top of the holding part for transfer of a heat to the semiconductor device directly when the semiconductor device is mounted in the test socket, and a compliance part fitted over the heating part for providing degrees of freedom for an alignment between the semiconductor device held by the holding part and the test socket.

The index head further includes a force transducer between the elevating carrier and the head holder for automatic measurement of a load applied by the elevating carrier in proportion to displacement of the elevating carrier with respect to the head holder when the semiconductor device mounted in the test socket is pressed down.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 8A–8D explain an operation principle of the compliance part in the head part in FIG. 6, wherein, FIG. 8A illustrates a state in which an alignment is made by the compliance part;

FIG. 8B illustrates an operation principle of the compliance part in a state an offset is occurred;

FIG. 8C illustrates an operation principle of the compliance part in a state a tilting is occurred; and, FIG. 8D illustrates an operation principle of the compliance part in a state a rotation is occurred.

DETAILED DESCRIPTION OF THE PREFERRED EMBODIMENT

Figure 1:
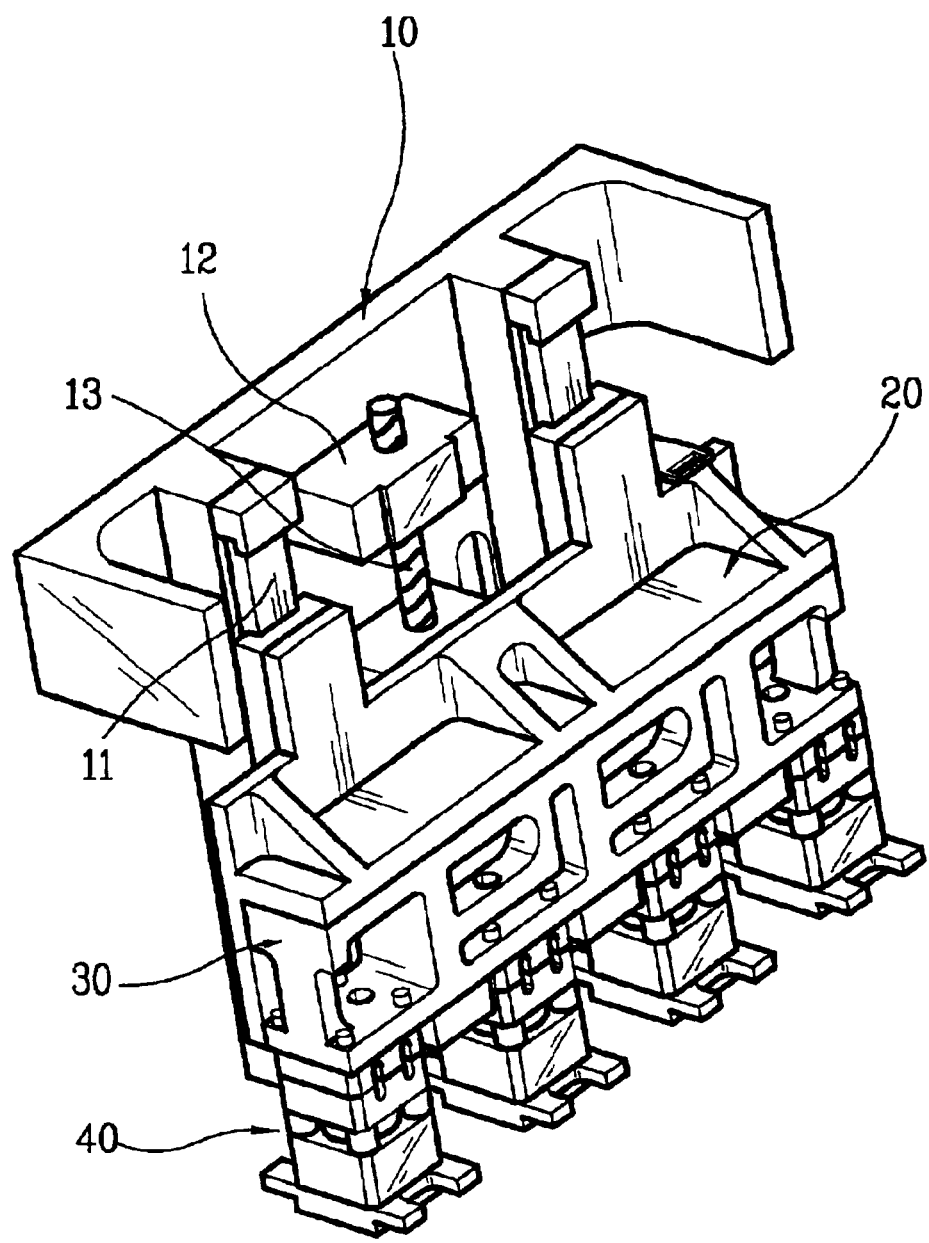
FIG. 1 illustrates a perspective view of an index head in accordance with a preferred embodiment of the present invention.
Figure 2A:
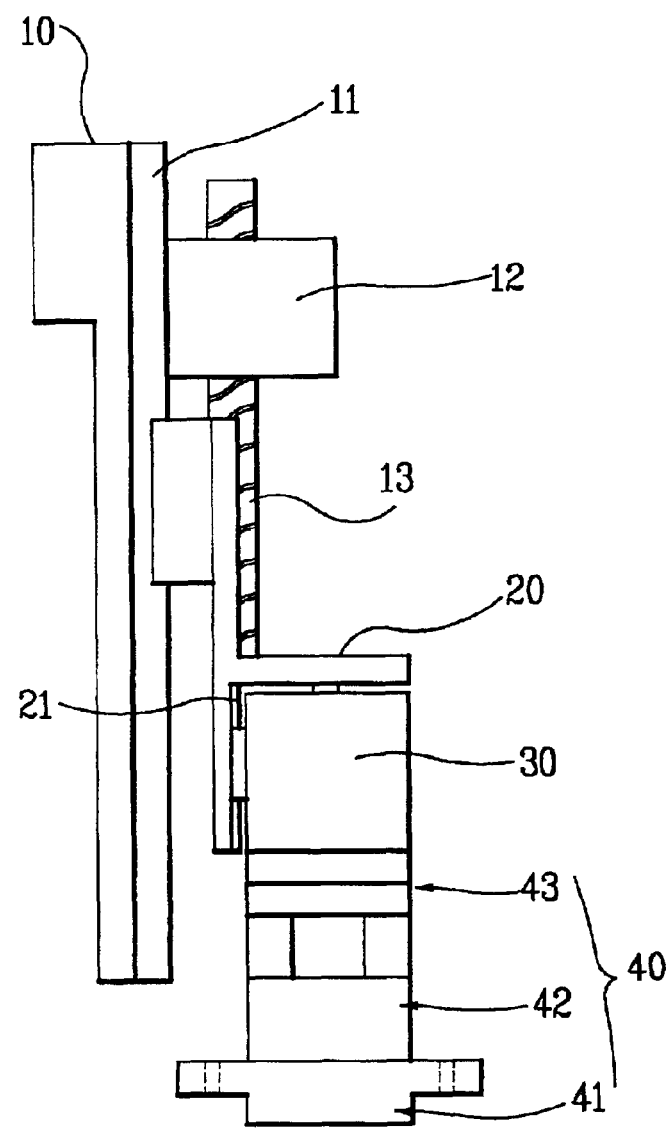
FIGS. 2A and 2B illustrate side sections of key parts of the index head in FIG. 1, each showing a system and operation of the index head.
Figure 2A:
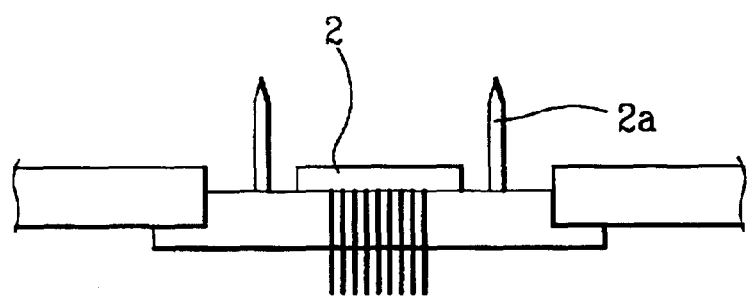
Figure 2B:
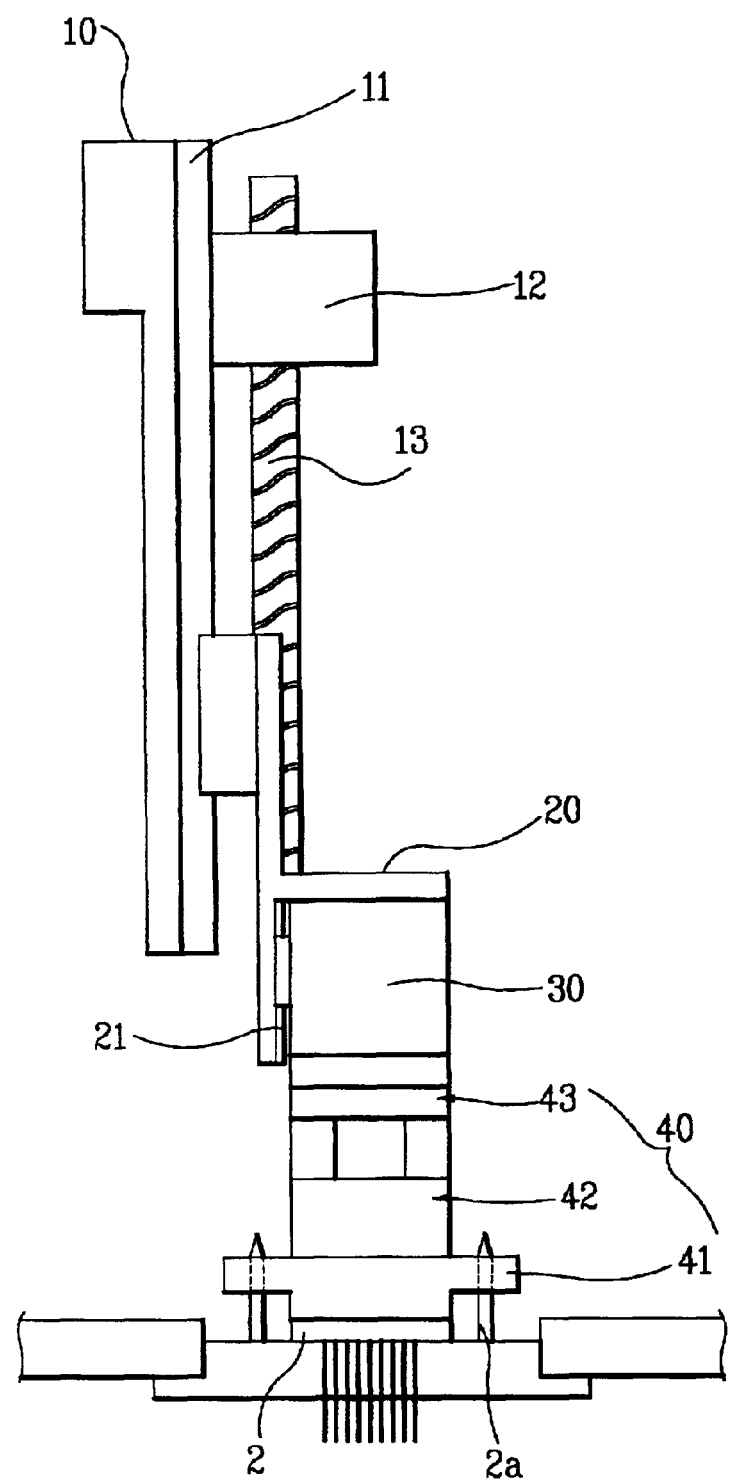

Reference will now be made in detail to the preferred embodiments of the present invention, examples of which are illustrated in the accompanying drawings. FIGS. 1, and 2A and 2B illustrate an entire system and operation an index head in accordance with a preferred embodiment of the present invention.

Referring to the drawings, the index head includes a carrier base 10 fitted to a transfer device (not shown) movable in X-Y-Z directions and/or a 'θ' direction, a rotation direction, within a test site (not shown), an elevating carrier 20 coupled to the carrier base 10 with an LM guide 11 in between, a ball screw 13 fitted to the carrier base 10 to be coupled to the elevating carrier 20 for transmission of an up/down driving force to the elevating carrier 20, and a servo motor 12 for driving the ball screw 13.

There is a head holder 30 under the elevating carrier 20 coupled thereto via an LM guide 21 for making relative movement with respect to the elevating carrier 20, and there are a plurality of heads 40 under the head holder 30 fixedly coupled thereto for holding the semiconductor devices 1 by vacuum and mounting/dismounting to/from the test sockets 2.

There is a load cell 35 in a central part of a top of the head holder 30 as a force transducer for measuring a load applied to the elevating carrier 20 in proportion to a displacement of the elevating carrier 20 with respect to the head holder 30 when the head 40 mounts the semiconductor device 1 to the test socket 2 and applies a pressure thereto, thereby controlling operation of the servo motor 12.

Figure 4:
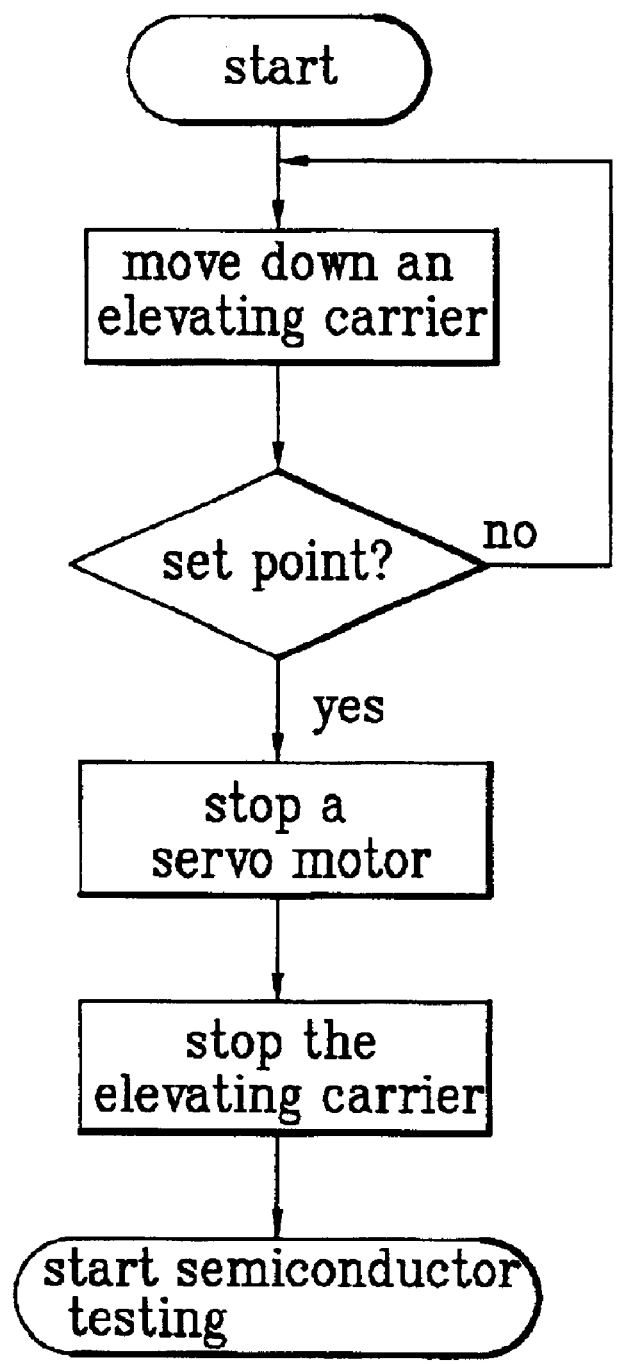
FIG. 4 illustrates a flow chart of control of the index head operation by using the load cell in FIG. 2A.
Figure 5:
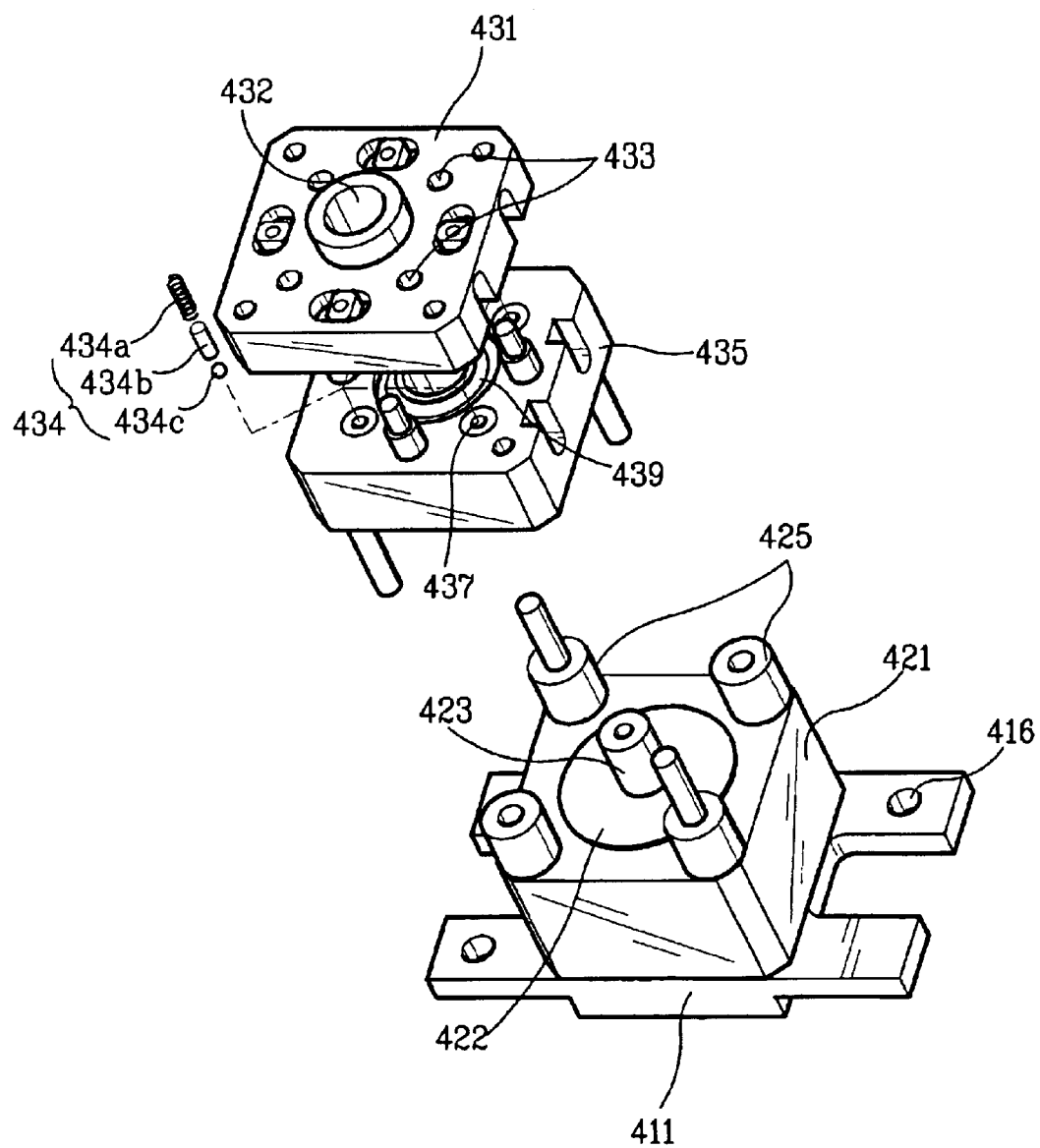
FIG. 5 illustrates a disassembled perspective view of a head part of the index head in FIG. 1.
Figure 6:
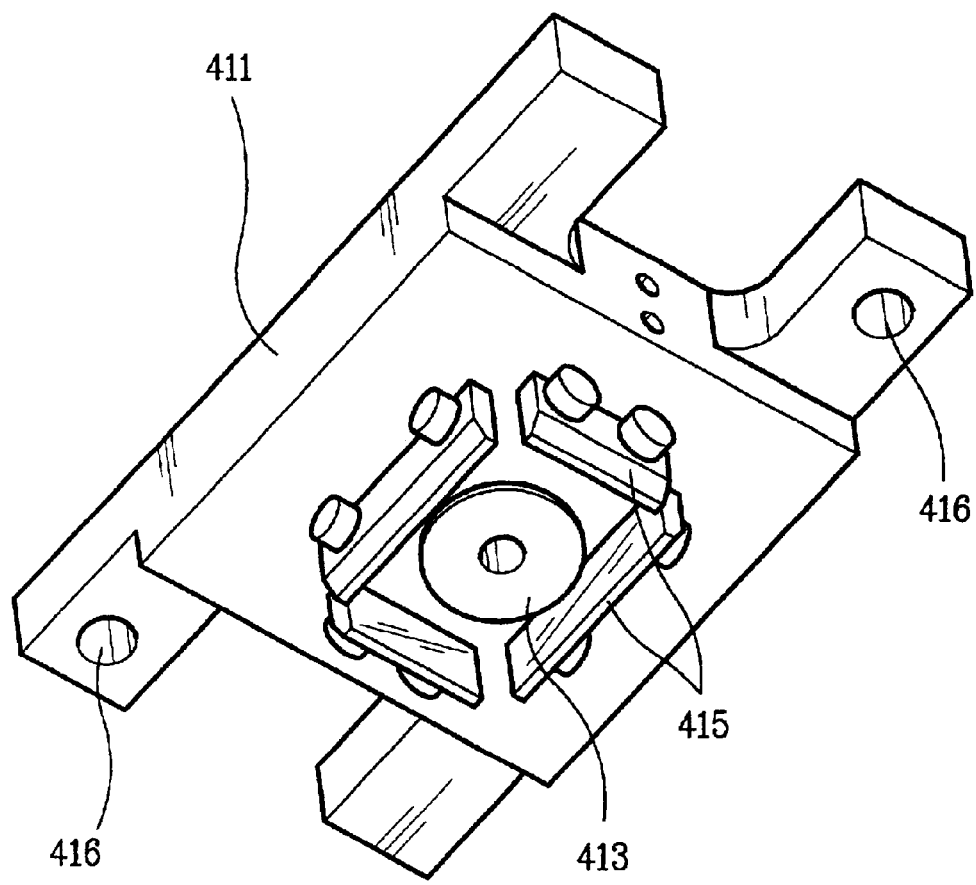
FIG. 6 illustrates a perspective view of a bottom of a holding part in the head part in FIG. 5.
Figure 7:
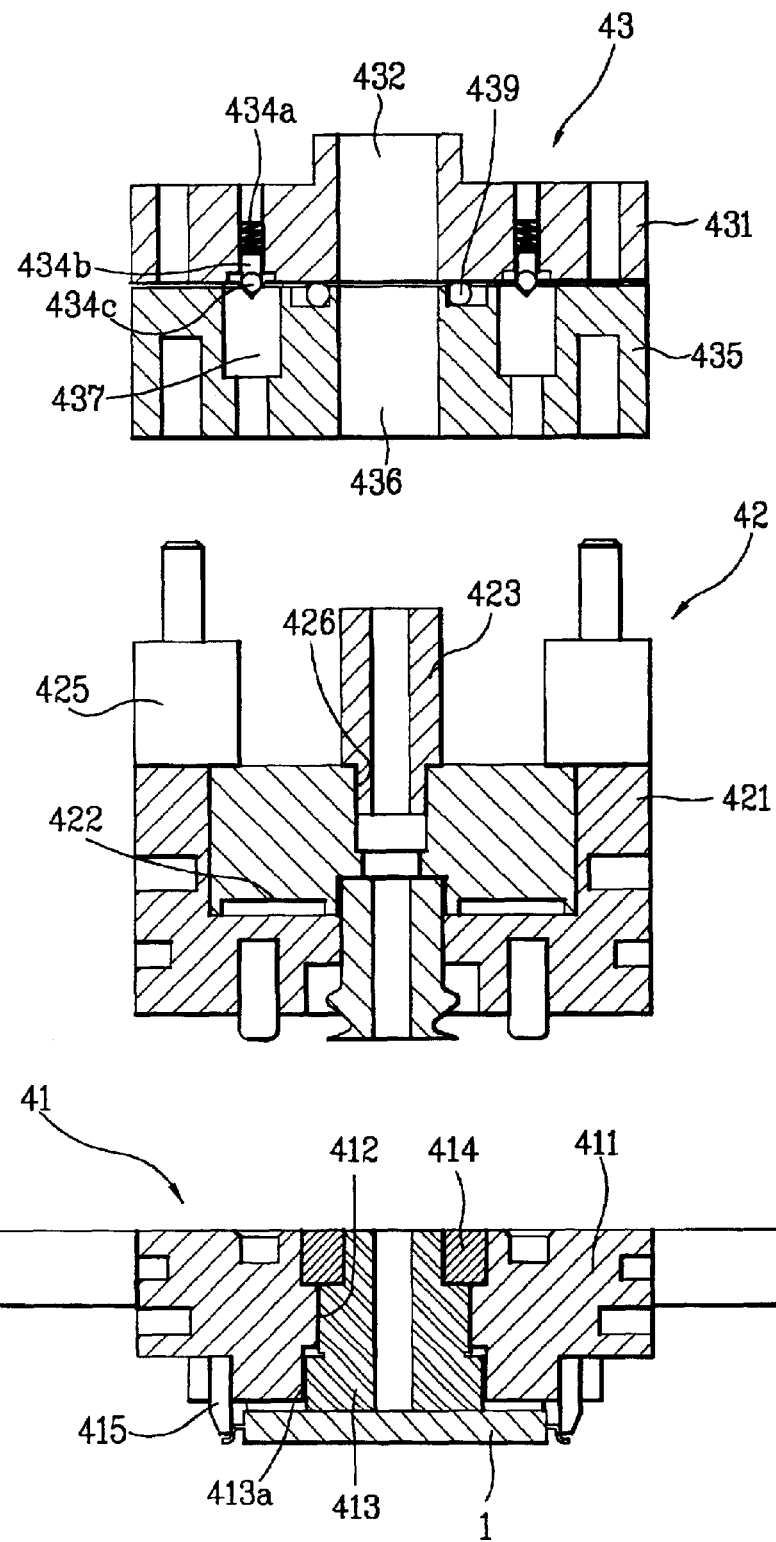
FIG. 7 illustrates a longitudinal section of key parts of disassembled head part in FIG. 5.

Accordingly, referring to FIG. 4, if the elevating carrier 20 moves down with respect to the head holder 30 in a state the index head 40 of the present invention mounts the semiconductor devices 1 to the test sockets 2, the load is measured in proportion to a degree of compression as the load cell 35 is compressed by the downward movement of the elevating carrier 20. When the load applied to the load cell 35 reaches to a preset point, i.e., to an appropriate load, a control part (not shown) which controls operation of the servo motor 12 senses it, and stops operation of the servo motor 12, under which condition the test of the semiconductor device is carried out.

Figure 3:
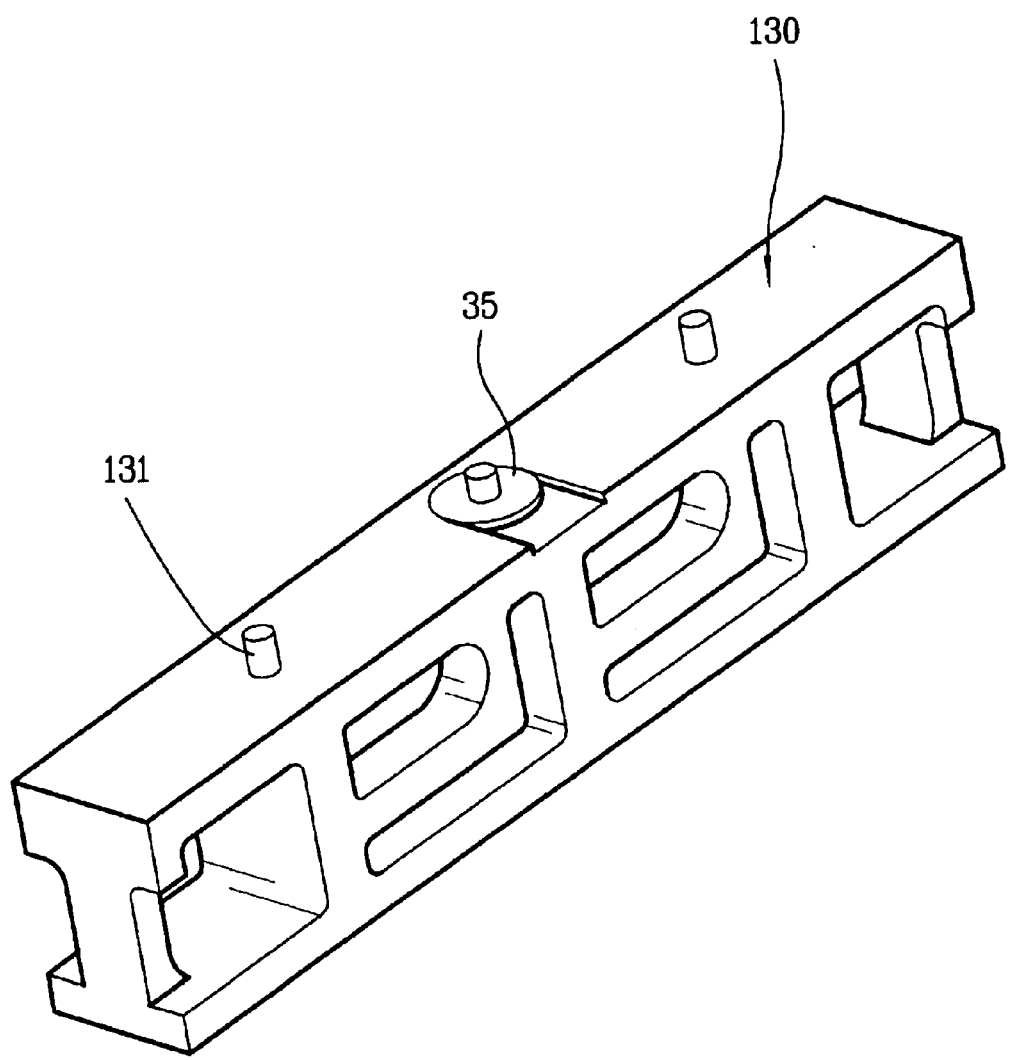
FIG. 3 illustrates a perspective view of a head holder part of the index head of the present invention.

By the way, referring to FIG. 3, the head holder 130 may be provided with one pair of guide pins 131 fitted on both sides of a top part thereof to couple with coupling holes correspondingly formed in the elevating carrier 20, thereby coupling the head holder 130 to the elevating carrier 20.

In the meantime, with regard the head structures illustrated in FIGS. 2A and 2B, the head 40 includes a holding part 41 fixedly fitted to a bottom of the head holder 30 for holding the semiconductor device by vacuum, a heating part 42 on top of the holding part 41 for transfer of a heat to the semiconductor device directly when the semiconductor device is mounted in the test socket 2, and a compliance part 43 fitted over the heating part 42 spaced therefrom for providing degrees of freedom for an alignment between the semiconductor device held by the holding part 41 and the test socket 2.

The holding part 41 in the head 40 includes a pocket block 411 of a conductive material with a good heat conductivity having a through hole 412 in a center for close contact coupling with the heating part 42, a floating nozzle 413 inserted in the through hole 412 in the pocket block 411 for holding the semiconductor device by vacuum, and a plurality of blades 415 of a non-conductive material vertical to a bottom surface of the pocket block for pressing leads of the semiconductor device held under the floating nozzle 413 to contact with terminal part (not shown) of the test socket 2.

The floating nozzle 413 in the holding part 41 is designed to allow a free movement in up/down directions for a distance within the through hole 412, by forming steps at an upper part and a lower part of the through hole 412 respectively to have diameters greater than an intermediate part thereof, coupling a nut 414 to an upper part of the floating nozzle 413 in a state the floating nozzle 413 is passed through the through hole 412, and forming an annular rim 413a on a lower part of the floating nozzle 413, to form a gap between the lower part step of the through hole 412 and the rim 413a of the floating nozzle 413 when the floating nozzle 413 is set on the through hole 412 by gravity, thereby allowing the free movement in up/down directions for a distance within the through hole 412 as much as the gap.

Accordingly, when the head 40 presses down the semiconductor device mounted in the socket 2 (see FIG. 1), a top surface of the semiconductor device is brought into contact with the bottom surface of the pocket block 411 as the floating nozzle 413 move upward.

There are positioning holes 416 in opposite side parts of the pocket block 411 in correspondence to, and to be inserted and passed through positioning pins 2a (see FIG. 8A) in the vicinity of the test socket 2 for accurate guidance of the head 40 to the test socket in a process the head 40 holds the semiconductor device and mounts in the test socket 2, wherein each of the positioning pins 2a on the test socket 2 has a conical peak for easy insertion of the head 40 even if there is a slight misalignment between the head 40 and the socket 2, for alignment between the head 40 and the test socket 2, together with the compliance part 43 explained, later.

In the meantime, the heating part 42 in the head 40 includes a heating block 421 on top of the holding part 41 having a built-in electric heater 422 for transfer of a heat to the pocket block 411, a through hole 426 in a central part of the heating block 421, and a coupling nozzle 423 passed through, and fixed to the through hole 426.

A lower end of the coupling nozzle 423 is fixed to a top end of the floating nozzle 413 in the holding part 41, and is formed of flexible silicone for free upward movement of the floating nozzle 413.

The heating block 421 has coupling bosses 425 at four corners of the top part for coupling with the compliance part 43. The coupling bosses 425 are formed of an insulating material for cutting off heat transfer from the heating block 421 to the compliance part 43.

In the meantime, the compliance part 43 includes a lower block 435 fixed to the heating part 42, and an upper block 431 coupled to the lower block 435 with allowances for having degrees of freedom in X-Y-Z and rotation θ directions.

There are a plurality of holes 433 for receiving ball plungers 434, compression springs 434*a*, retainers 434*b* fitted to lower ends of the compression springs 434*a*, and balls 434*c* retained under the retainers 434*b* and exposed outside of the bottom surface of the upper block 431.

The lower block 435 has ball buttons 437 of conical recess at positions corresponding to the holes 433 in the upper block 431 for receiving the balls 434*c* in the ball plungers 434.

There is a coupling hole 432 or 436 in each central part of the upper block 431 and the lower block 435, for coupling with the coupling nozzle 423, and there is an O-ring 439 between the upper block 431 and the lower block 435 for improvement of air tightness at a contact part of the two coupling holes 432 and 436.

In the meantime, a top part of the coupling hole 432 in the upper block 431 is connected to an external air pump (not shown) for evacuation.

The operation of the compliance part 43 will be explained with reference to FIGS. 8A–8D.

Figure 8A:
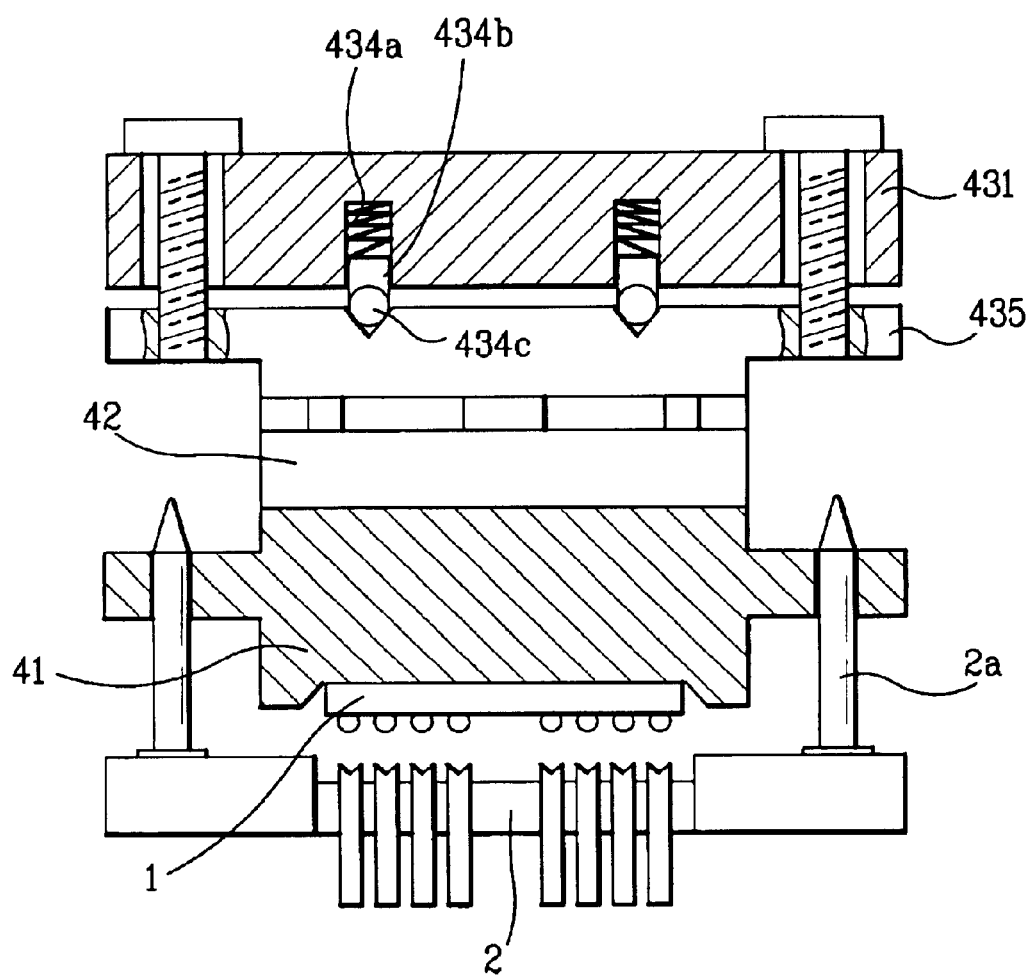

FIG. 8A illustrates a state in which an alignment between the head 40 and the test socket 2 is made by the compliance part 43, to mount the semiconductor device 1 in the test socket 2, wherein, when the holding part 41 in the head 40 moves down onto the test socket 2 in a state the holding part 41 holds the semiconductor device 1, the head 40 is guided to the test socket 2 to mount the semiconductor device 1 in the socket 2 as the positioning pins 2*a* on the test socket 2 are inserted into the positioning holes 416 in the pocket block 411 of the head 40.

If there is an alignment error between the head 40 and the test socket 2 caused by tolerances in assembly, or fabrication of the index head and/or the test socket, the alignment error is corrected in a process the positioning pins 2*a* are inserted into the pocket block 411 in the head 40 because the upper block 431 and the lower block 435 in the compliance part 43 has coupled with degrees of freedom in X-Y-Z and rotation θ directions.

Figure 8B:
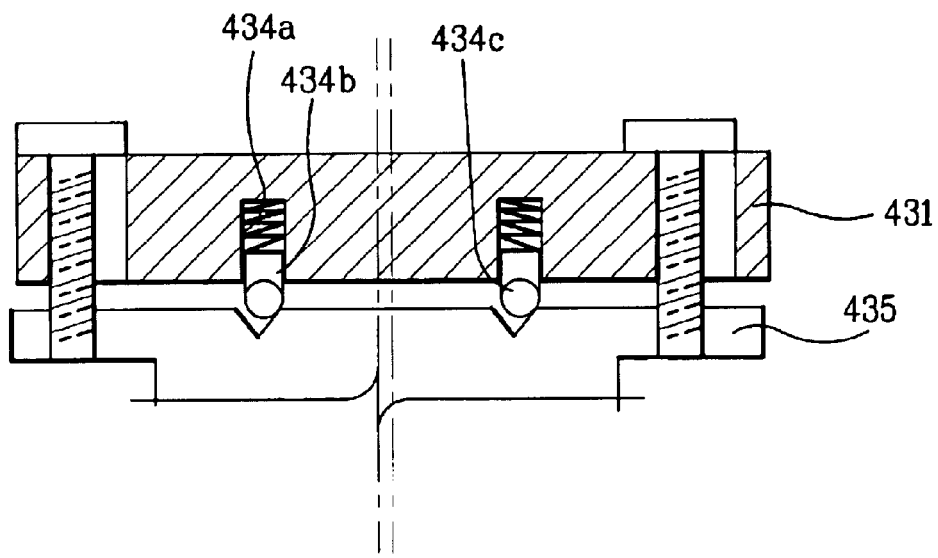
Figure 8C:
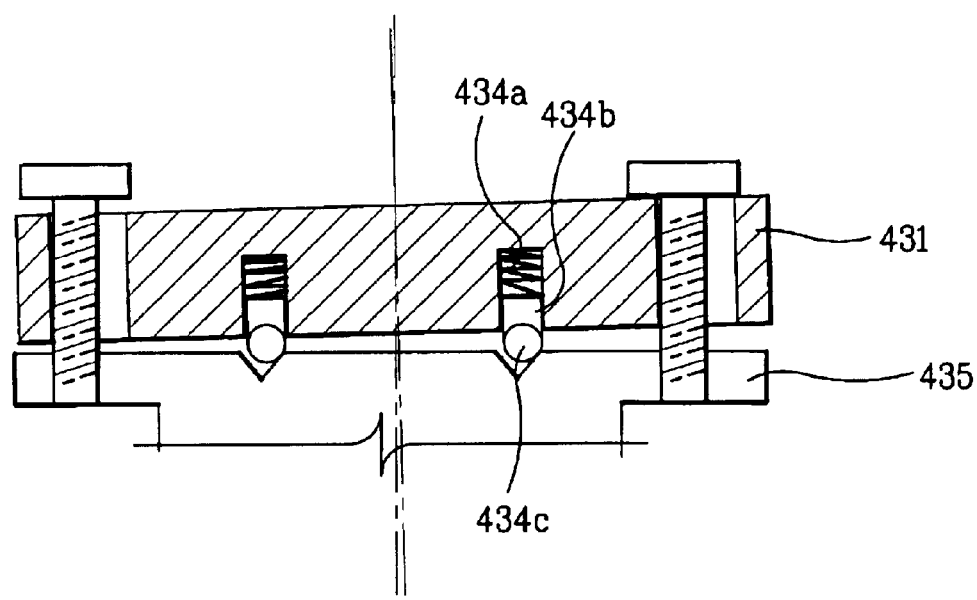
Figure 8D:
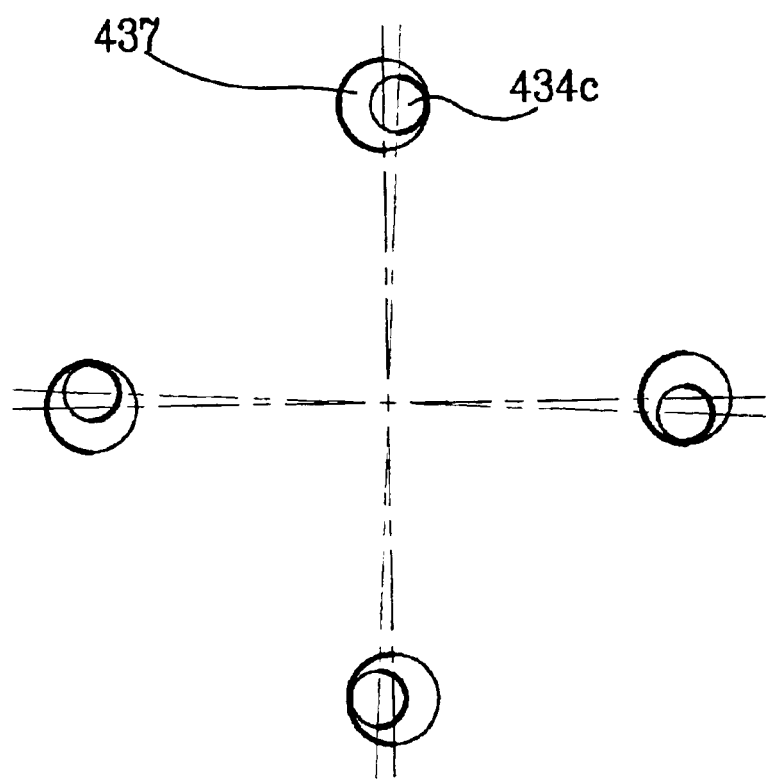

That is, referring to FIGS. 8B, 8C, and 8D, if there is the alignment error, such as offset error, tilting error, or rotation error, between the head 40 and the test socket 2, a position is corrected by a relative positional movement between the lower block 435 and the upper block 431 in the compliance part 43 in a process the positioning pins 416 are inserted into the positioning holes 416 in the head 40 when the head 40 moves down toward the test socket 2.

Of course, a limit of the alignment error correction by the compliance part 43 is within a range the positioning holes 416 move down by gravity guided by the conical parts at top ends of the positioning pins 2*a* when the head 40 moves down. The operation of the foregoing index head will be explained.

When a test tray or a carrier containing semiconductor devices to be tested comes to a test site of the handler, the holding part 41 in the head 40 of the index head holds the semiconductor device and moves to a position right upper side of the test socket 2.

Thus, when the index head comes to the upper side of the test socket 2, the servo motor 12 on the carrier base 10 comes into operation to move down the elevating carrier 20 along the LM guide 11, until the semiconductor device 1 is mounted in the test socket 2 as the positioning holes 416 in the head 40 are inserted into the positioning pins 2*a* at the test socket 2.

As explained, even if there is an alignment error between the head 40 and the test socket 2 caused by tolerances in assembly, or fabrication of the index head and/or the test socket, the semiconductor device can be mounted in the test socket 2 accurately as the alignment between the head 40 and the test socket 2 is made by the compliance part 43 in the head 40.

In this instance, as the floating nozzle 413 in the holding part 41 in the head 40 that holds the semiconductor device moves upward on the same time the semiconductor device 1 is mounted in the test socket 2, to bring a top surface of the semiconductor device 1 to come into contact with the bottom surface of the pocket block 411.

If the servo motor 12 moves down the elevating carrier 20 further in a state the semiconductor device 1 is mounted in the socket 2, the elevating carrier 20 moves down with respect to the head holder 30, to press down the semiconductor device 1, when, as explained, the elevating carrier 20 presses down the load cell 35 in proportion to the downward movement of the elevating carrier 20 with respect to the head holder 30 until the load on the load cell 35 reaches to a preset point, when operation of the servo motor 12 is stopped, and the test is started.

When the test is started in this state, the electric heater 422 in the heating part 42 is put into operation to heat the heating block 421, the heat is transferred to the pocket block 411, and to the semiconductor device 1 in contact with the pocket block 411 continuously, thereby preventing temperature drop of the semiconductor device.

When the test of the semiconductor device is finished at the test socket 2, the semiconductor device is dismounted from the test socket 2 in a process reverse of the foregoing mounting process, and placed in an empty tray or carrier.

As has been explained, the index head in a semiconductor device test handler of the present invention has the following advantages.

The accurate control of the force applied to the semiconductor device may means of the force transducer fitted to the head holder improves a test reliability and permits an easy adjustment of the applied force.

The direct transfer of a heat to the semiconductor device, without blowing hot air thereto the same as the related art, for prevention of temperature drop of the semiconductor device permits an easy and accurate temperature control, and protect other parts of the equipment that require no temperature drop prevention.

Along with this, the smooth alignment between the index head and/or the test socket by the compliance part permits to progress the test faster than before because the index head has a small vibration even in high speed operation of the index head.

It will be apparent to those skilled in the art that various modifications and variations can be made in the index head in a semiconductor device test handler of the present invention without departing from the spirit or scope of the invention. Thus, it is intended that the present invention cover the modifications and variations of this invention provided they come within the scope of the appended claims and their equivalents.

What is claimed is:

1. An index head assembly for a semiconductor device test handler, comprising:

a carrier base configured to be fixed to a transfer device of the handler;

an elevating carrier movably coupled to the carrier base and configured to be raised and lowered relative to the carrier base;

an elevating device configured to raise and to lower the elevating carrier relative to the carrier base;

a head holder movably coupled to a lower portion of the elevating carrier via at least one guide member and configured to move in a vertical direction relative to the elevating carrier; and a plurality of heads fixed to the head holder, wherein each of the plurality of heads comprises:

a holding part configured to hold a semiconductor device with a vacuum force;

a heating part positioned on an upper portion of the holding part and configured to generate and to transfer heat directly to the semiconductor device when the semiconductor device is mounted in a test socket of the handler; and a compliance part positioned on an upper portion of the heating part and configured to properly align the semiconductor device held by the holding part and the test socket.

2. The index head assembly as claimed in claim 1, further comprising a force transducer positioned between the elevating carrier and the head holder and configured to measure a load applied by the elevating carrier based on a displacement of the elevating carrier with respect to the head holder when the semiconductor device mounted in the test socket is pressed down.

3. The index head assembly as claimed in claim 2, wherein the force transducer comprises a load cell.

4. The index head assembly as claimed in claim 1, wherein the at least one guide member comprises guide pins positioned on opposite end portions of an upper portion of the head holder and configured to be inserted into corresponding holes in the elevating carrier so as to allow the head holder be movable in a vertical direction relative to the elevating carrier.

5. The index head assembly as claimed in claim 1, wherein the at least one guide member comprises a pair of linear motion (LM) guides fitted to the elevating carrier in so as to be oriented in a vertical direction, and a corresponding pair of LM blocks fixed to a rear surface of the head holder and coupled to the pair of LM guides.

6. The index head assembly as claimed in claim 1, wherein the compliance part comprises:

an upper block fixed to the head holder and comprising a plurality of holes formed in a lower portion thereof;

a plurality of ball plungers each comprising an elastic body configured to be inserted into and retained in a corresponding hole of the plurality of holes formed in the upper block, a retainer coupled to a lower end of the elastic body, and a ball configured to be retained under the retainer such that a portion of the ball is exposed at a bottom surface of the upper block;

a lower block configured to be coupled to a bottom portion of the upper block with a preset allowance therebetween; and a plurality of recesses formed in an upper surface of the lower block at positions corresponding to the holes formed in the upper block, wherein the plurality of recesses are configured to receive and to hold the balls of the plurality of ball plungers.

7. The index head assembly as claimed in claim 1, wherein the heating part comprises:

a heating block formed of a conductive material and comprising a heater configured to generate and to transfer heat to the holding part;

a through hole formed in a central portion of the heating block; and a coupling nozzle coupled to the compliance part with a space formed therebetween, wherein the coupling nozzle is configured to be inserted into and fixed in the through hole so as to form a vacuum therein.

8. The index head assembly as claimed in claim 7, wherein a lower end of the coupling nozzle is configured to be flexible.

9. The index head assembly as claimed in claim 8, wherein a lower end of the coupling nozzle is formed of an elastic material.

10. The index head assembly as claimed in claim 9, wherein a lower end of the coupling nozzle is formed of silicone.

11. The index head assembly as claimed in claim 7, wherein the holding part comprises:

a pocket block formed of a conductive material and configured to closely contact a bottom surface of the heating block;

a through hole formed in a center portion of the pocket block;

a floating nozzle configured to be inserted into and coupled to the through hole, and to be connected to the coupling nozzle so as to absorb and to hold the semiconductor device with a vacuum force; and a plurality of blades formed of a non-conductive material and positioned vertical to a bottom surface of the pocket block, wherein the plurality of blades are configured to press on leads of the semiconductor device so as to bring the leads into contact with a terminal part of the test socket.

12. The index head assembly as claimed in claim 7, wherein the heater comprises an electric heater.

13. The index head assembly as claimed in claim 1, wherein the holding part comprises:

a pocket block formed of a conductive material and configured to closely contact a lower surface of the heating part;

a through hole formed in a center portion of the pocket block;

a floating nozzle configured to be inserted into and coupled to the through hole, and to be connected to the heating part so as to absorb and to hold the semiconductor device with a vacuum force; and a plurality of blades formed of a non-conductive material and positioned so as to be oriented in a vertical direction relative to a bottom surface of the pocket block, wherein the plurality of blades are configured to press on leads of the semiconductor device so as to bring the leads into contact with a terminal part of the test socket.

14. The index head assembly as claimed in claim 13, wherein the floating nozzle is configured to be movably coupled to the through hole so as to allow vertical movement of the floating nozzle through a preset distance.

15. The index head assembly as claimed in claim 14, wherein the through hole comprises steps formed at an upper part and a lower part of the through hole each with diameters greater than an intermediate part of the through hole, and wherein the floating nozzle comprises rims extending outward from an upper part and a lower part of the floating nozzle and configured to engage with the steps so as to limit vertical movement of the floating nozzle in the through hole.

16. The index head assembly as claimed in claim 13, wherein the heating part comprises a heating block, and wherein the pocket block is configured to closely contact a bottom surface of the heating block.

17. The index head assembly as claimed in claim 13, wherein the heating part comprises a coupling nozzle, and wherein the floating nozzle is configured to be coupled to the coupling nozzle.

18. The index head assembly as claimed in claim 1, further comprising a plurality of positioning holes formed in the holding part of the head and configured to receive a plurality of positioning pins positioned proximate the test socket.

19. The index head assembly as claimed in claim 18, wherein the plurality of positioning holes are configured to mate with the plurality of positioning pins to accurately guide a head of the plurality of heads onto a corresponding test socket of the handler.

20. The index head assembly as claimed in claim 1, wherein the elevating device comprises:
 a linear motion (LM) guide fixed to the carrier base;
 a LM block fixed to the elevating carrier and coupled to the LM guide;
 a ball screw fixed to the carrier base and coupled to the elevating carrier; and
 a motor configured to drive the ball screw.

21. The index head assembly as claimed in claim 1, wherein the compliance part is configured to provide a plurality of degrees of freedom to the plurality of heads so as to properly align the semiconductor device in the test socket.

* * * * *